United States Patent [19]

Kawata et al.

[11] Patent Number: 5,662,962
[45] Date of Patent: Sep. 2, 1997

[54] TRANSPARENT, ELECTROCONDUCTIVE SUBSTRATE AND METHOD FOR FORMING THE SAME

[75] Inventors: Munekazu Kawata; Masaya Yukinobu, both of Niihama, Japan

[73] Assignee: Sumitomo Metal Mining Company, Limited, Tokyo, Japan

[21] Appl. No.: 406,408

[22] Filed: Mar. 20, 1995

Related U.S. Application Data

[62] Division of Ser. No. 329,404, Oct. 27, 1994, abandoned.

[30] Foreign Application Priority Data

Oct. 28, 1993 [JP] Japan .................................. 5-270816
Dec. 28, 1993 [JP] Japan .................................. 5-334856
May 26, 1994 [JP] Japan .................................. 6-136523

[51] Int. Cl.$^6$ .................................................. B05D 5/12
[52] U.S. Cl. ............................ 427/126.2; 427/126.3; 427/240; 427/376.2; 427/427; 427/443.2
[58] Field of Search ........................ 427/126.2, 126.3, 427/240, 376.2, 427, 443.2; 437/228

[56] References Cited

U.S. PATENT DOCUMENTS

| | | | |
|---|---|---|---|
| 4,345,000 | 8/1982 | Kanozne et al. ................. | 428/212 |
| 4,435,048 | 3/1984 | Komimori et al. ............... | 350/357 |
| 4,619,704 | 10/1986 | Hashimoto et al. ............ | 106/296.4 |
| 4,769,058 | 9/1988 | McMaster ........................ | 65/104 |
| 4,977,013 | 12/1990 | Ritchie et al. ................... | 428/212 |
| 5,225,273 | 7/1993 | Mikoshiba et al. ............. | 428/323 |
| 5,395,678 | 3/1995 | Matsushima et al. ........... | 428/201 |
| 5,411,792 | 5/1995 | Yukinobu et al. ............... | 428/212 |
| 5,421,926 | 6/1995 | Yukinobu et al. ............... | 156/83 |

*Primary Examiner*—Benjamin Utech
*Attorney, Agent, or Firm*—Watson Cole Stevens Davis, PLLC

[57] ABSTRACT

A transparent, electroconductive ink having therein ultra-fine ITO particles dispersed in a solvent or in a solvent containing a resin dissolved therein is coated and dried on a transparent support, then dried and optionally baked, and thereafter an overcoating liquid consisting essentially of silica sol is coated over the resulting transparent, electroconductive film formed on the support. This is then dried and optionally baked to obtain a transparent, electroconductive substrate having a specific resistance of 0.01 to 0.5 Ω.cm, a haze value of 0 to 2%, and a volume content of the ultra-fine ITO particles in the film of being 40 to 75%. The substrate has a small surface resistivity and has excellent optical characteristics and weather resistance.

13 Claims, 5 Drawing Sheets

(1) RESISTANCE BETWEEN AU ELECTRODES : 1.95 x 10$^4$ Ω/□
(2) MEASUREMENT WITH 4-NEEDLES PROBE : 3.6 x 10$^4$ Ω/□
(3) IMPEDANCE-MEASURING METHOD : 1.77 x 10$^4$ Ω/□

(1) RESISTANCE BETWEEN AU ELECTRODES : $1.95 \times 10^4$ Ω/☐

(2) MEASUREMENT WITH 4-NEEDLES PROBE : $3.6 \times 10^4$ Ω/☐

(3) IMPEDANCE-MEASURING METHOD : $1.77 \times 10^4$ Ω/☐

TRANSPARENT, ELECTROCONDUCTIVE SUBSTRATE AND METHOD FOR FORMING THE SAME

This application is a divisional application of application Ser. No. 08/329,404, filed 27 Oct. 1994 now abandoned.

FIELD OF THE INVENTION

The present invention relates to a transparent, electroconductive substrate most suitably used in liquid crystal displays (LCD), electrodes in solar batteries, etc., and antistatic shields or electromagnetic wave shields in Braun tubes, etc., and also to a method for forming the same.

BACKGROUND OF THE INVENTION

In general, transparent, electroconductive substrates are obtained by filming an oxide such as indium-tin oxide (hereinafter referred to as "ITO") or antimony-tin oxide ("ATO") on a glass support by sputtering or CVD, or are obtained by coating a transparent, electroconductive ink containing a powder of ultra-fine, electroconductive particles having a particle size smaller than the smallest wavelength of visible rays on a support such as a glass support, followed by drying it on the support, which is then baked at high temperatures of 400° C. or higher.

However, the former method mentioned above needs expensive devices and its producibility and yield are low, by which, therefore, it was difficult to obtain low-priced, transparent, electroconductive substrates. On the other hand, the electroconductive film formed on the support by the latter method mentioned above has some gaps remained between the ultra-fine particles thereon so that light scatters on the film, which, therefore, have poor optical properties. In order to fill the gaps, heretofore, a process has been proposed in which a glass-forming component is incorporated into the transparent, electroconductive ink prior to forming the transparent, electroconductive substrate. However, the glass-forming component is problematic in that it exists between the ultra-fine, electroconductive particles, thereby increasing the surface resistivity of the electroconductive film to be formed on the support. For this reason, therefore, it was difficult to satisfy both the optical characteristics of the transparent, electroconductive substrate and the desired conditions for the value of the surface resistivity of the same by the above-mentioned latter method. In addition, the transparent, electroconductive substrate formed by the above-mentioned latter method has been found to have another problem about its weather resistance in that, when it is allowed to stand in air for several months, the resistance of the film coated thereon increases probably because of the deterioration of the film itself in the presence of water in air.

The present invention has been made in consideration of these problems in the related prior arts, and its object is to provide a transparent, electroconductive substrate having a small surface resistivity and having excellent optical characteristics and weather resistance and to provide a method for forming the substrate.

SUMMARY OF THE INVENTION

The first embodiment of the present invention is a transparent, electroconductive substrate composed of a support capable of transmitting visible rays therethrough, a transparent, electroconductive film formed on said support and having therein ultra-fine ITO particles with a mean particle size of 0.1 μm or less dispersed in a binder consisting essentially of silica, and an overcoat film formed on said transparent, electroconductive film and consisting essentially of silica; which is characterized in that the volume content of the ultra-fine ITO particles in said transparent, electroconductive film is from 40 to 75% by volume, that the specific resistance of said transparent, electroconductive film is from 0.01 to 0.5 Ω.cm, and that the haze value of the film is from 0.5 to 2% when the thickness of said transparent, electroconductive film is from 0.5 to 2 μm while it is from 0 to 1% when the thickness of said transparent, electroconductive film is less than 0.5 μm.

The second embodiment of the present invention is a method for forming a transparent, electroconductive substrate, in which a transparent, electroconductive ink to be obtained by dispersing ultra-fine ITO particles in a solvent is coated and dried on a support capable of transmitting visible rays therethrough to thereby form thereon a transparent, electroconductive film consisting of a single substance of said ultra-fine oxide particles, and thereafter an overcoating liquid consisting essentially of silica sol is coated on said transparent, electroconductive film and then dried or dried and baked.

The third embodiment of the present invention is a method for forming a transparent, electroconductive substrate, in which a transparent, electroconductive ink to be obtained by dispersing ultra-fine ITO particles in a solvent or in a solvent containing a thermoplastic resin dissolved therein is coated on a transparent support capable of transmitting visible rays therethrough and then dried and baked to thereby form a transparent, electroconductive film on the support, and thereafter an overcoating liquid consisting essentially of silica sol is coated on said transparent, electroconductive film and then dried or dried and baked.

DETAILED DESCRIPTION OF THE INVENTION

As the support capable of transmitting visible rays therethrough, usable in the present invention are soda lime glass (transition point, 660° C.), low-alkali glass (transition point, 670° C.), non-alkali glass (transition point, 730° C.), etc. In addition to these, also usable are silicon-based semiconductor supports, etc.

As the electroconductive filler to be in the electroconductive ink, highly-electroconductive, ultra-fine ITO particles are employed in the present invention. In addition, also usable as the electroconductive filler are other ultra-fine particles of oxides having a particle size smaller than the shortest wavelength of visible rays, such as antimony-tin oxide (ATO) as well as zinc oxide-aluminium oxide, ruthenium oxide ($RuO_2$), rhenium trioxide ($ReO_3$), etc. If desired, ultra-fine particles of these oxides may be blended and the resulting blends may also be used in the present invention.

The overcoating liquid for use in the present invention may comprise silica sol to be obtained by hydrolyzing an alkyl silicate and its lower condensate in the presence of a catalyst such as hydrochloric acid, etc.

The transparent, electroconductive ink is coated on the support and the solvent in the ink is vaporized by drying. The drying is preferably conducted slowly so as to attain the closest packing of the electroconductive, ultra-fine particles existing in the ink. To coat the transparent, electroconductive ink and the overcoating liquid on the support, employable are various methods of wire bar coating, doctor blade coating, spin coating, dip coating, spray coating, etc.

In the present invention, the transparent, electroconductive ink comprises electroconductive, ultra-fine particles of ITO having a particle size of 0.1 μm or less, preferably from 0.01 to 0.05 μm, as the filler, and a solvent, or comprises such electroconductive, ultra-fine particles of ITO, a thermoplastic resin as a binder, and a solvent. The binder resin is added to the ink so as to control the viscosity of the ink. Therefore, it is not indispensable, depending on the coating method employed. In order to obtain a satisfactory dispersion of the ultra-fine ITO particles, minor amounts of additives such as surfactant, dispersing agent, etc. may be added to the ink. The solvent may be any organic solvent to be used for preparing ordinary paints and inks or may also be water.

The organic solvent employable in the present invention includes, for example, ketone solvents such as acetone, methyl ethyl ketone, methyl isobutyl ketone, cyclohexanone, isophorone, diacetone alcohol, etc.; alcohol solvents such as methyl alcohol, ethyl alcohol, isopropyl alcohol, butyl alcohol, etc.; ester solvents such as ethyl acetate, butyl acetate, etc.; polyalcohol derivatives such as cellosolve, butyl cellosolve, butyl carbitol, butyl carbitol acetate, etc.; as well as N-methylpyrrolidone, N,N-dimethylformamide, etc.

The transparent, electroconductive ink is in such a condition that the ultra-fine ITO particles have been sufficiently dispersed in the solvent. Therefore, this may form an electroconductive film comprising a single substance of the ultra-fine particles. In order to obtain a satisfactory dispersion of the ultra-fine ITO particles, minor amounts of additives such as surfactant, etc. may be added to the ink.

In the method of the second embodiment of the present invention, the transparent, electroconductive ink does not contain any component to be a binder. Therefore, the method finally gives an electroconductive film comprising a single substance of the ultra-fine particles. On the other hand, even if the transparent, electroconductive ink contains a resin binder according to the method of the third embodiment of the present invention, the transparent ink is coated and dried on the transparent support and thereafter heated in air at about 400° C. to thereby oxidize and fire the resin and a small amount of the remaining solvent in the ink. Also, therefore, the method finally gives an electroconductive film comprising a single substance of the ultra-fine particles. The electroconductive film comprising such a single substance of the ultra-fine particles has gaps between the ultra-fine particles, and the gaps are factors to scatter light, thereby worsening the optical characteristics (e.g., haze value) of the electroconductive film. As the case may be, the adhesion of the film to the support is often weak due to such gaps. In addition, the contact area between the electroconductive, ultra-fine particles is not firm, by which the surface resistivity of the film may be enlarged.

In order to improve the optical characteristics of the final electroconductive film and to reduce the value of the surface resistivity of the film, therefore it is necessary to use a transparent, electroconductive ink having the ultra-fine ITO particles sufficiently dispersed therein and to slowly dry the support after having been coated with the transparent, electroconductive ink, thereby making the volume content of the ultra-fine ITO particles in the electroconductive film fall within the range of from 40 to 75% by volume, preferably from 50 to 70% by volume. This is because, if the content is less than 40% by volume, the value of the surface resistivity of the film will be large so that the optical characteristics of the film will be poor.

According to the present invention, an overcoating liquid is coated over the thus-formed electroconductive film. The overcoating liquid well penetrates between the ultra-fine ITO particles in the electroconductive film so that both the binder part in the electroconductive film and the overcoat film are formed at the same time. Accordingly, as compared with the conventional, transparent, electroconductive substrate to be formed by incorporating a glass-forming component into a transparent electroconductive ink followed by coating the ink on a support, the transparent, electroconductive substrate of the present invention has better optical characteristics and electroconductivity.

In addition, quite independently of the formation of the electroconductive film, the binder part may be varied according to the present invention. Therefore, for example, silica sol containing fluorine (F) may be employed, or the overcoating liquid may contain, in addition to silica sol, any other zirconia compound, titanium compound, aluminium compound or their hydrolysates, etc. Using these, the optical characteristics (e.g., transmittance, haze value, refractive index, reflectivity) of the film may be controlled.

According to the present invention, the overcoating liquid is coated and then dried, whereby the coated liquid is hardened to be an overcoat film on the transparent, electroconductive film. The drying of the coated liquid is effected at 80° C. or higher, preferably at 150° to 180° C.

After the electroconductive film has been coated with the overcoat film, the silica sol having been in the overcoating liquid firmly bonds the ultra-fine ITO particles to one another while it also firmly bonds to the support with the result that the film strength of the transparent, electroconductive film formed on the support is noticeably increased. For instance, when the ITO film is overcoated by this method, its pencil strength may be elevated to about 9H.

If the thickness of the overcoat film is too large, the film will be cracked due to the shrinking stress during hardening. If, on the other hand, it is too small, the gaps existing in the transparent, electroconductive film cannot be completely filled so that the optical characteristics of the film cannot be improved. For these reasons, it is desired that the thickness of the overcoat film shall be such that it is enough to completely fill the gaps in the electroconductive film but is not too thick. When an ordinary overcoating liquid comprising silica sol is used, it is desired that the thickness of the overcoat film to be coated on the ultra-fine powder-containing, electroconductive film (having a thickness of from 0 to 2 μm) 0.4 μm or less.

After having overcoated, the overcoating liquid comprising silica sol penetrates into the electroconductive film and is hardened therein, by which the gaps in the film are filled so that light applied to the film is prevented from scattering thereon. In this way, the optical characteristics of the transparent, electroconductive film are significantly improved. According to the present invention, therefore, a transparent, electroconductive substrate having a haze value of from 0.5 to 2% is obtained when the thickness of the transparent, electroconductive film is from 0.5 to 2 μm, while that having a haze value of from 0 to 1% is obtained when the thickness of the same film is less than 0.5 μm.

According to the method of the second embodiment of the present invention, after the electroconductive film comprising a single substance of ultra-fine ITO particles has been formed on the support, the overcoating liquid comprising silica sol is overcoated on the film, whereupon the resulting overcoat film is hardened and shrunk with the result that the lower-existing, transparent, electroconductive film receives the resulting shrinking stress, by which the contact area between the electroconductive, ultra-fine particles in the electroconductive film are firmly bonded to one another to lower the value of the surface resistivity of the film. For instance, due to the hardening of the overcoat film, the specific resistance of the electroconductive film to be from 30 to 120 Ω.cm is lowered to from 0.05 to 0.3 Ω.cm.

Accordingly, even at low temperatures of approximately from 150° to 180° C., a low-resistance, transparent, electroconductive film may be formed in the present invention. In addition, however, the overcoating liquid coated is dried, hardened and thereafter heated in air at about 400° C. or higher, thereby promoting the sintering of the contact area between the electroconductive, ultra-fine particles. Further, it may be heated at 400° to 600° C. in an inert gas atmosphere, thereby introducing oxygen defects into the electroconductive, ultra-fine particles to much lower the resistance of the electroconductive film. In this way, a transparent, electroconductive substrate having a specific resistance of the coated film of being approximately from 0.01 to 0.5 Ω.cm may be obtained.

According to the method of the third embodiment of the present invention, a transparent, electroconductive ink is coated and dried on a transparent support, and then heated in air at about 400° C. to thereby oxidize and fire the resin and a small amount of the remaining solvent in the ink. During the process, the electroconductive, ultra-fine particles in the film formed are sintered at the contact areas between the particles so that the strength of the electroconductive film formed is increased and the adhesion of the film to the glass support is improved. In addition, the thus-coated support may be heated in an inert gas atmosphere at 400° C. to 600° C. so as to introduce oxygen defects into the electroconductive, ultra-fine particles, thereby lowering the resistance of the electroconductive film. By the baking, therefore, a transparent, electroconductive film having a reduced resistance may be formed. Afterwards, an overcoating liquid consisting essentially of silica sol is coated over the film and dried at temperatures of 80° C. or higher, or dried at such temperatures and then baked at temperatures of 300° C. or higher to heat and harden the coated liquid, by which an overcoat film is formed on the transparent, electroconductive film.

The baking of the overcoating liquid that has been coated and dried on the transparent, electroconductive film is preferably effected at temperatures of 300° C. or higher in an inert gas atmosphere. This is because, if the baking is effected in air, the oxygen defects that have been introduced into the electroconductive, ultra-fine particles will be removed by the oxidation during the baking so that the resistance of the transparent, electroconductive film will be increased.

The transparent, electroconductive film thus formed has noticeably improved optical characteristics, as the scattering of light applied thereto is reduced. In addition, since the film structure to be obtained is a two-layered structure composed of the electroconductive film having a high refractive index and the overcoat film having a low refractive index, the transparent, electroconductive substrate having such a two-layered structure may additionally have a non-glare function. The refractive index of ultra-fine ITO particles is about 2.0 and that of the overcoat film is about 1.46, so that the refractive index of the electroconductive film may be the intermediate between the refractive index of the ultra-fine ITO particles and that of the overcoat film. To impart a non-glare function to the transparent, electroconductive substrate of the present invention, it is necessary to elevate the refractive index of the electroconductive film. For this, it is necessary to increase as much as possible the packing percentage of the ultra-fine ITO particles in the film and to completely fill the gaps between the ultra-fine ITO particles with the overcoating liquid applied thereto.

According to the present invention, since the volume content of the ultra-fine ITO particles in the electroconductive film is from 40 to 75% by volume or, that is, the particles have been packed extremely closely in the film, while the gaps between the particles have been filled with the overcoating liquid, the refractive index of the electroconductive film is elevated to approximately from 1.7 to 1.85. From this viewpoint, the transparent, electroconductive substrate to be obtained by the present invention is considered good.

Since the above-mentioned non-glare function is imparted to the transparent, electroconductive substrate of the present invention by defining the thickness of the electroconductive film to be λ/4, λ/2, etc., the thickness of the same film is restricted. If desired, therefore, it is possible to apply non-glare treatment to the surface of the electroconductive film when the film is made thick (for example, having a thickness of 0.3 μm or more). According to this method, a non-glare film having a surface resistivity of $10^3$ Ω/□ or less at temperatures of 200° C. or lower may be formed.

Since the transparent, electroconductive film has been coated with the top-coat film, the penetration of water from air into the electroconductive film may be prevented. Therefore, even if the transparent, electroconductive substrate of the present invention is allowed to stand in air, the variation in its surface resistivity is little and the substrate itself may have improved weather resistance.

To measure the surface resistivity of the film coated on a transparent, electroconductive substrate such as that of the present invention, various methods such as those mentioned below are known.

(A) Prior to the formation of the electroconductive film, parallel electrodes are formed on the support, and the resistance between the electrodes is measured.

(B) A four-needles probe or two-needles probe is applied to the overcoat film (silicate) to measure the resistance of the electroconductive film.

(C) A parallel electrode is formed on the overcoat film (silicate), and the impedance of the substrate is measured with AC of from 10 kHz to 1 MHz. From the thus-measured impedance value, its resistance is derived.

The method (A) is the most reliable one but the formation of the electrodes is not easy. In addition, the electrodes to be formed must be extremely thin. If not, they will have some bad influence on the formation of the electroconductive film and the overcoat film. The method (B) is the most simple. However, if this is applied to a transparent, electroconductive substrate having a relatively high-resistance overcoat film formed on the electroconductive film, such as that of the present invention, the measured values will often be distributed much so that accurate data could not be obtained (as the case may be, data somewhat higher than the actual values will be obtained). Therefore, this is problematic in the accuracy of the data to be obtained by it. According to the method (C), the resistance of the electroconductive film may be obtained relatively easily and accurately.

Figure 3:
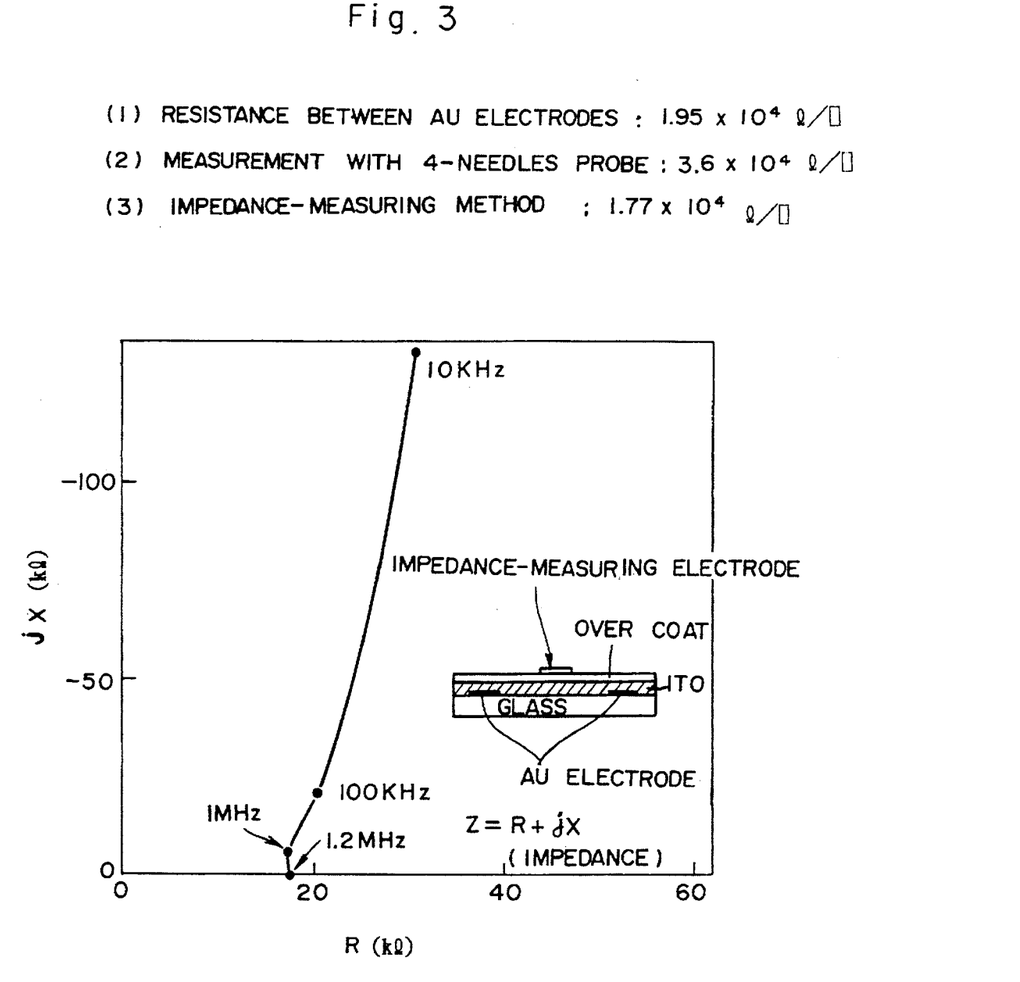
FIG. 3 shows examples for measuring the surface resistivity of the transparent, electroconductive substrate of the present invention.

In the electroconductive ITO film to be on the transparent, electroconductive substrate of the present invention, the ITO particles are extremely fine and the packing percentage of these particles is high, and, in addition, the surface of the film is smooth. Therefore, if the resistance of the film is measured by the method (B) through the overcoat film, the measured data will often be distributed much when the thickness of the overcoat film is large. FIG. 3 shows one example of measuring the impedance of the electroconductive substrate of the present invention according to the method (C), along with the data measured by the methods (A) and (C). As is known therefrom, the data obtained by the methods (A) and (C) are almost the same. It is noted, therefore, that the impedance-measuring method (C) can accurately indicate the resistance of the electroconductive film. This is because, since the overcoat film (silicate) on the electroconductive film easily passes high-frequency AC therethrough, the resistance of the lower electroconductive film may accurately be measured even from above the overcoat layer.

The present invention will be described in more detail by means of the following examples, which, however, are not whatsoever intended to restrict the scope of the present invention.

EXAMPLE 1

Figure 2:
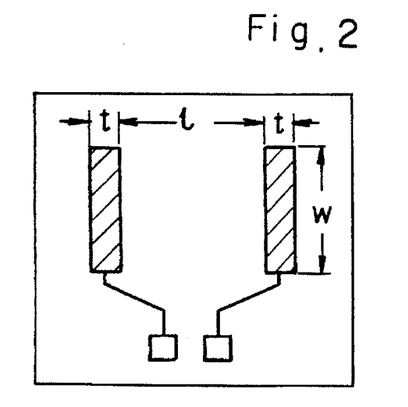
FIG. 2 is a schematic view showing the support fitted with electrodes, used in Example 1, in which 1 is a support and 2 is an electrode.

On a soda lime glass support 1 having a size of 75 mm×75 mm and a thickness of 1 mm, an Au paste (M. O. Au Paste; made by N. E. Chemcat) that had been diluted with a diluting thinner (A-4182; made by N. E. Chemcat) was printed by screen printing, using a 200-mesh printing screen, as shown in FIG. 2. This was leveled for 10 minutes at room temperature and then dried for 20 minutes at 120° C. This was baked for 30 minutes in air at 550° C. and then cooled to form Au electrodes 2 each having a thickness of from 0.1 to 0.2 μm on the transparent support. In FIG. 2, W is 3.5 cm, t is 0.5 cm and 1 is 3.5 cm.

On the transparent support, coated was a transparent, electroconductive ITO ink (DX-101; made by Tohoku Kako KK, having an ITO content of 63.8%) prepared by dispersing ultra-fine ITO particles having a mean particle size of 0.03 μm (UFP-HX; made by Sumitomo Metal Mining Co.) in a solvent (isophorone), using a wire bar having a diameter of 0.075 mm. Then, this was dried under heat with far-infrared rays at 40° C. for 10 minutes and again dried at 80° C. to prepare an un-overcoated, transparent, electroconductive substrate. Its surface resistivity (between the electrodes), its optical characteristics (whole-ray transmittance and haze value) and its film thickness were measured. The thus-measured data are shown in Table 1 below.

The whole-ray transmittance and the haze value of the coated film were measured while the film was on the support, using a directly-reading haze computer HGM-ZDP (made by Suga Tester Co.). The whole-ray transmittance as referred to herein means a visual transmittance of visible rays having a wavelength range of from 380 nm to 780 nm, and the rays include both linear rays and scattered rays. The haze value means a ratio of scattered rays to whole rays and is represented by the following equation (1).

---

Haze Value (%) =
[(Transmittance of Scattered Rays,
%)/(Transmittance of Whole Rays)] × 100 . . . (1)

---

The thickness of the electroconductive film formed was measured by observing the cross-section of a part of the sample with a scanning electromicroscope.

On the same soda lime glass support as that used above (but not having the Au electrodes), the same transparent, electroconductive film was formed in the same manner as above. The difference between the weight of the uncoated support and that of the support coated with the film, the thickness of the film coated and the area of the film coated were measured. From the thus-measured data, the volume content of the ITO particles (as % by volume) in the electroconductive film coated was calculated according to the equation (2) mentioned below. The coated film was dried in such a way that no solvent remained in the dried film. After thus dried, this was again dried at 200° C. for 10 minutes. Then, the weight of the coated support was measured. The results thus obtained are shown in Table 1 below.

---

Volume Content of ITO Particles in
Electroconductive Film (vol. %) =
[(Weight of ITO Film, g)/{(Coated Area, cm$^2$) ×
(Thickness of Film, μm) × 7.2 (g/cm$^3$, specific
gravity of ITO)}] × 100 . . . (2)

---

Next, an overcoating liquid prepared by diluting 10 g of a solution, that had been obtained by mixing 40 g of tetraethyl silicate (ES-40; made by Colcoat Co.), 40 g of ethyl alcohol and 13.8 g of 0.2N-hydrochloric acid followed by hydrolyzing the resulting mixture at 40° C. for 2 hours, with 10 g of ethanol was coated over the electroconductive layer by spin-coating at a rotation speed of 1200 rpm, then dried at room temperature for 5 minutes and again dried at 150° C. for 20 minutes to form an overcoated, transparent, electroconductive substrate. The surface resistivity (as resistance between the electrodes) and the optical characteristics (whole-ray transmittance, have value) of the thus-formed substrate were measured. The film thickness of the overcoated substrate was measured, using a surface roughness meter Surfcom 900A (made by Tokyo Seimitsu KK). The results obtained are shown in Table 1.

The mean particle size of the ultra-fine ITO particles used in this example was one obtained from the specific surface area of each particle (measured by BET absorption method), assuming that each particle was of a true sphere. Apart from this, the particle size was measured, using the photograph of the particles taken by transmission electromicrophotography, from which it was also confirmed that all the particles had almost the same particle size and that few of them aggregated together.

EXAMPLE 2

The same process as in Example 1 was repeated, except that 7 g of the transparent, electroconductive ITO ink (DX-101; made by Tohoku Kako KK) were diluted with 3 g of isophorone and used, to obtain an un-overcoated, transparent, electroconductive substrate and an overcoated, transparent, electroconductive substrate. The data obtained by measuring them are shown in Table 1 below.

EXAMPLE 3

The same process as in Example 1 was repeated, except that 5 g of the transparent, electroconductive ITO ink (DX-101; made by Tohoku Kako KK) were diluted with 5 g of isophorone and used, to obtain an un-overcoated, transparent, electroconductive substrate and an overcoated, transparent, electroconductive substrate. The data obtained by measuring them are shown in Table 1 below.

EXAMPLE 4

The same process as in Example 1 was repeated, except that 2 g of the transparent, electroconductive ITO ink (DX-101; made by Tohoku Kako KK) were diluted with 8 g of isophorone and this was coated on the transparent support by spin coating at a rotation speed of 1200 rpm, to obtain an un-overcoated, transparent, electroconductive substrate and an overcoated, transparent, electroconductive substrate. The data obtained by measuring them are shown in Table 1 below.

EXAMPLE 5

An overcoated, transparent, electroconductive substrate was formed in the same manner as in Example 4, and this was heat-treated at 450° C. in air for 30 minutes and then at 450° C. in a nitrogen atmosphere for 20 minutes. Thus, a baked, transparent, electroconductive substrate was obtained. The data obtained by measuring it are shown in Table 1 below.

EXAMPLE 6

Figure 1:
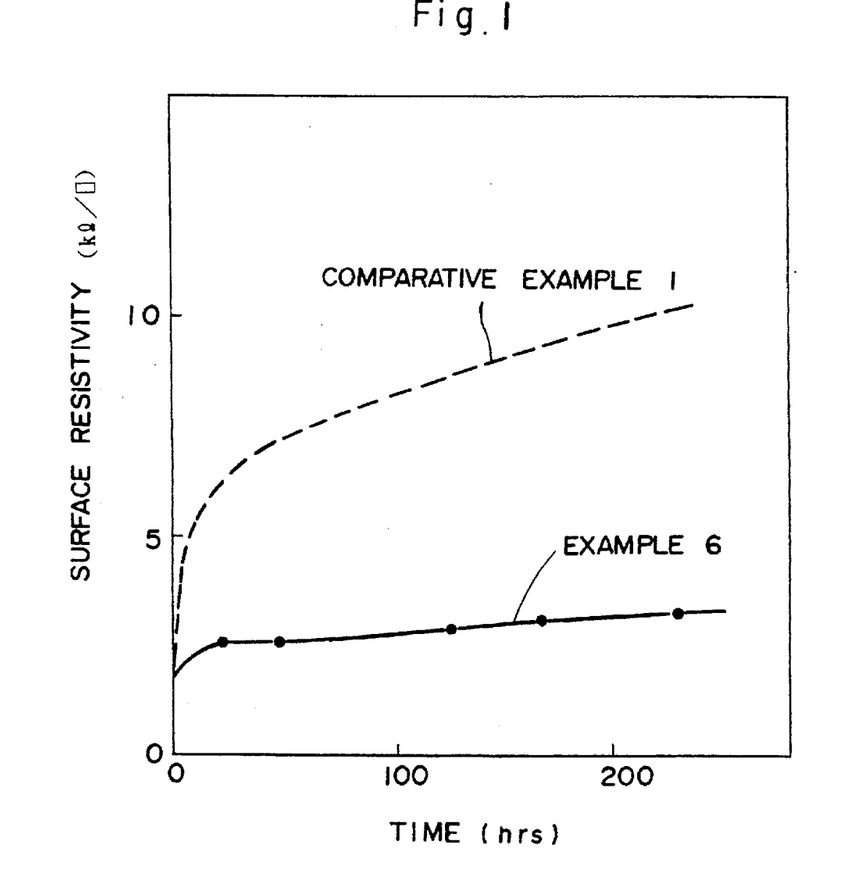
FIG. 1 shows the variation in the surface resistivity of the transparent, electroconductive substrates obtained in Example 6 and Comparative Example 1, in a high-temperature atmosphere.

The baked, transparent, electroconductive substrate obtained in Example 5 was allowed to stand at a temperature of 50° C. and at a relative humidity of 90%, whereupon the variation in its surface resistivity was measured. The results obtained are shown in FIG. 1.

COMPARATIVE EXAMPLE 1

A transparent, electroconductive film was formed on the support in the same manner as in Example 1 and, without overcoating this, this was heat-treated at 450° C. in air for 30 minutes and then at 450° C. in a nitrogen atmosphere for 20 minutes. The thus-obtained, transparent, electroconductive substrate was allowed to stand at a temperature of 50° C. and at a relative humidity of 90%, whereupon the variation in its surface resistivity was measured. The results obtained are shown in FIG. 1.

EXAMPLE 7

The transparent, electroconductive substrates obtained in Example 4 and Example 5 were dipped in a boiling water for 30 minutes, then the water was removed, and the substrates were kept at room temperature and humidity for 5 minutes, whereupon their outward appearances, optical characteristics and resistance values were observed and measured. No change was admitted in the two, with respect to their outward appearances, optical characteristics and resistance values.

EXAMPLE 8

Ultra-fine ITO particles having a mean particle size of 0.025 μm, a tin content of 5.8% by weight and a green compact resistance (measured under 100 kgf/cm$^2$) of 0.36 Ω.cm (SUFP-HX; made by Sumitomo Metal Mining Co.) were dispersed in a solvent (isophorone) and then filtered to obtain transparent, electroconductive ITO ink 1 (having an ITO content of 11.7% by weight) shown in Table 2 below. This was coated on a soda lime glass having a size of 75 mm×75 mm and a thickness of 1.1 mm, by spin coating at room temperature and humidity (20° C., relative humidity of 60%) and at a rotation speed of 1200 rpm. Then the difference between the weight of the uncoated support and that of the support coated with the film, the thickness of the film coated and the area of the film coated were measured. From the thus-measured data, the volume content of the ITO particles (as % by volume) in the electroconductive film coated was calculated. To elevate the accuracy in the measurement, the coating and the drying of the electroconductive film were repeated three times, by which the thickness of the film coated was made increased. The data thus obtained are shown in Table 3 below.

Next, overcoating liquid 1 prepared by formulating a silica sol, that had been obtained by mixing 40 g of tetraethyl silicate (made by Colcoat Co.), 40 g of ethyl alcohol and 13.8 g of 0.2 N-hydrochloric acid followed by hydrolyzing the resulting mixture at 40° C. for 6 hours, into the composition shown in Table 2 below was coated over the electroconductive layer by spin-coating at a rotation speed of 180 rpm, then allowed to stand at room temperature for 2 minutes at the same rotation speed, and dried at 180° C. for 30 minutes to form an overcoated, transparent, electroconductive substrate. The surface resistivity and the optical characteristics (whole-ray transmittance, have value, visual reflectivity) of the thus-formed substrate were measured. The data thus obtained are shown in Table 3 below.

The surface resistivity was measured by two methods, one being a four-needles probing method and the other being an impedance-measuring method. For the former four-needles probing method, used was LORESTA MCP-T400 (made by Mitsubishi Petrochemical Co.). For the latter impedance-measuring method, used was LF Impedance Analyzer 4192A (made by Yokokawa Hewlett-Packard Co.). The whole-ray transmittance and the haze value were measured, while the film was on the support, using a directly-reading haze computer EGM-ZDP (made by Suga Tester Co.). The visual reflectivity was measured by the D-O method defined by JISZ-8722, using a colorimeter (CR-300; made by Minolta Camera Co.), after a black oily paint (Mitsubishi Paint Marker PX-30) had been coated on the back surface of the glass support. The measured data were represented by means of Y of the tristimulus values and the chromaticity coordinates x and y in the XYZ chromaticity diagram defined by the Commission Internationale de l'Eclairage (CIE). The value Y indicates the visual reflectivity. The film thickness of the overcoated substrate was measured, using a surface roughness meter Surfcom 900A (made by Tokyo Seimitsu KK).

EXAMPLE 9

Using the same ultra-fine ITO particles as those in Example 8, the same process as in Example 8 was repeated, except that the transparent, electroconductive ITO ink 2 (having an ITO content of 27.5% by weight) shown in Table 2 and the overcoating liquid 2 shown in Table 2 were used, to obtain a transparent, electroconductive substrate. This was tested in the same manner as in Example 1, and the results obtained are shown in Table 3 below.

EXAMPLE 10

Using the same ultra-fine ITO particles as those in Example 8, the transparent, electroconductive ITO ink 3

(having an ITO content of 1.9% by weigh) shown in Table 2 was obtained. This was coated on a soda lime glass (having a size of 300 mm×210 mm and a thickness of 2 mm) that had been heated at 40° C., by spin coating at a temperature of 20° C. and at a relative humidity of 60° C., while the support was being rotated at a rotation speed of 180 rpm for 3 minutes so as to dry the ITO film coated. Next, the overcoating liquid 3 shown in Table 2 was coated thereover, by spin coating. Then, this was still rotated at 180° C. for 2 minutes and thereafter dried at 180° C. for 30 minutes. After thus hardened, an overcoat film was formed on the ITO film. During the spin coating, a glass plate having a size of 290 mm×200 mm and a size of 10 mm, that had been heated at 40° C., was put below the soda lime glass support, by which the lowering of the temperature of the support during the spin coating process was prevented as much as possible. In the continuous, spin coating process to form the ITO film and the overcoat film, the temperature of the support lowered by 10° C., from 40° C. to 30° C. The transparent, electroconductive substrate thus prepared by the continuous spin coating process was tested in the same manner as in Example 1. The data measured are shown in Table 3 below.

EXAMPLE 11

Figure 4:
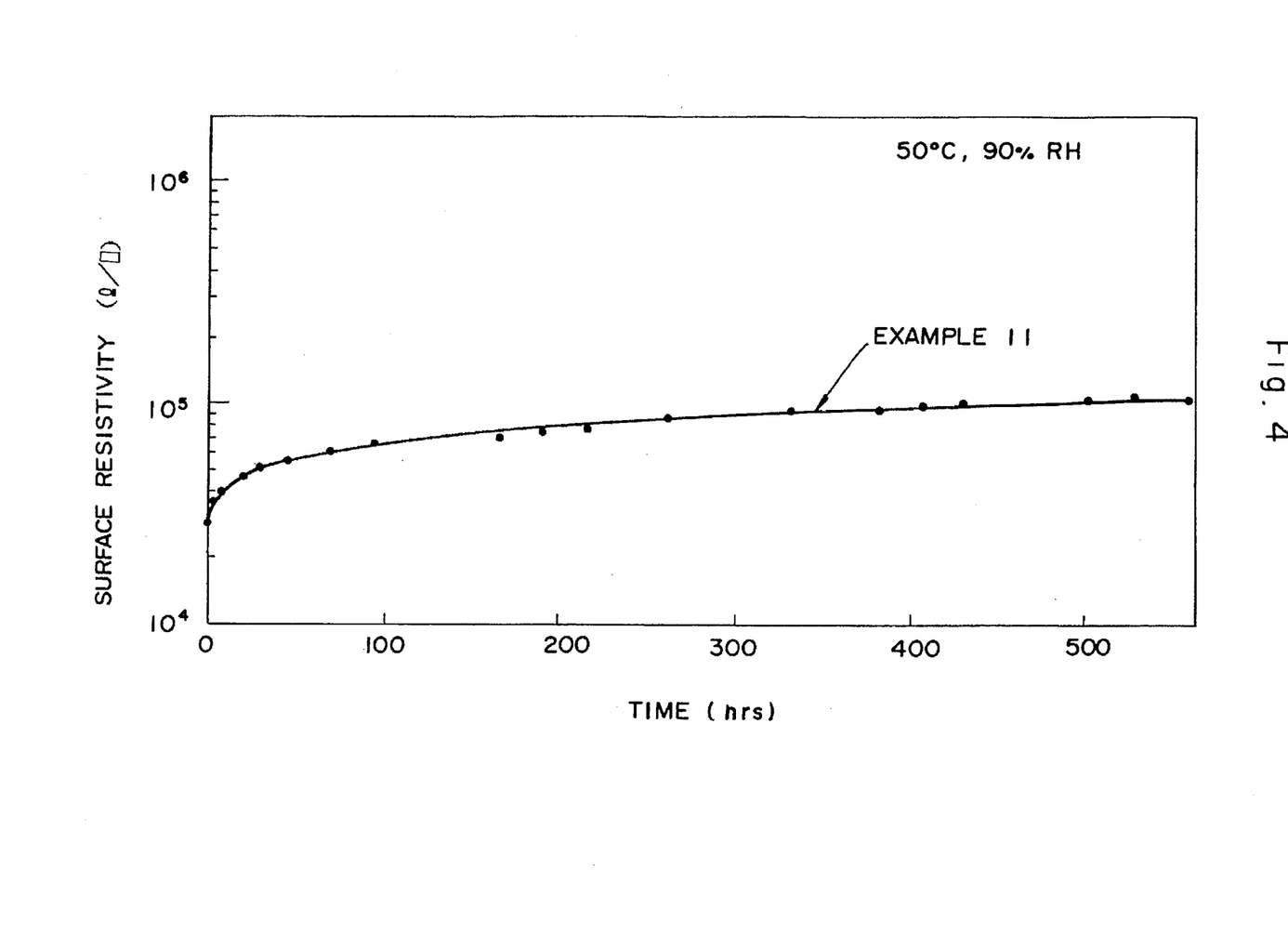
FIG. 4 shows the variation in the surface resistivity of the transparent, electroconductive substrate obtained in Example 11.

A transparent, electroconductive substrate that had been obtained by the same process as in Example 10 was allowed to stand at a temperature of 50° C. and at a relative humidity of 90%, whereupon the variation in its surface resistivity was measured. The results obtained are shown in FIG. 4.

COMPARATIVE EXAMPLE 2

The whole-ray transmittance, the haze value and the visual reflectivity of the-soda lime glass support used in Examples 8 and 9 were measured in the same manner as in Example 8, and the data obtained are shown in Table 3 below.

COMPARATIVE EXAMPLE 3

The whole-ray transmittance, the haze value and the visual reflectivity of the soda lime glass support used in Example 10 were measured in the same manner as in Example 8, and the data obtained are shown in Table 3 below.

EXAMPLE 12

Figure 5:
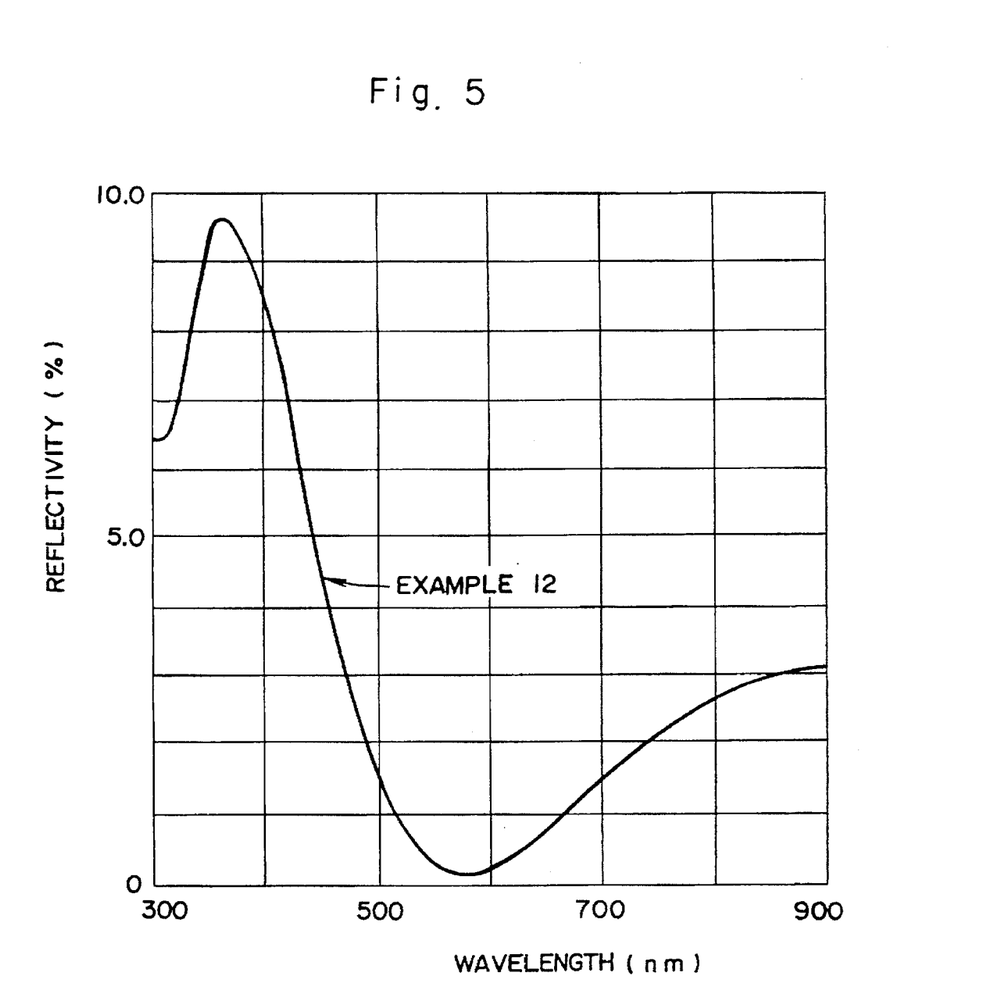
FIG. 5 shows the spectral reflectivity of the transparent, electroconductive substrate obtained in Example 12.

The spectral reflectivity of the transparent, electroconductive substrate having a surface resistivity (measured by 4-needles probing method) of 28.4 kΩ/□, a whole-ray transmittance of 95.9% and a haze value of 0.2 that had been obtained by the same process as in Example 8, is shown in FIG. 5.

EXAMPLE 13

Figure 6:
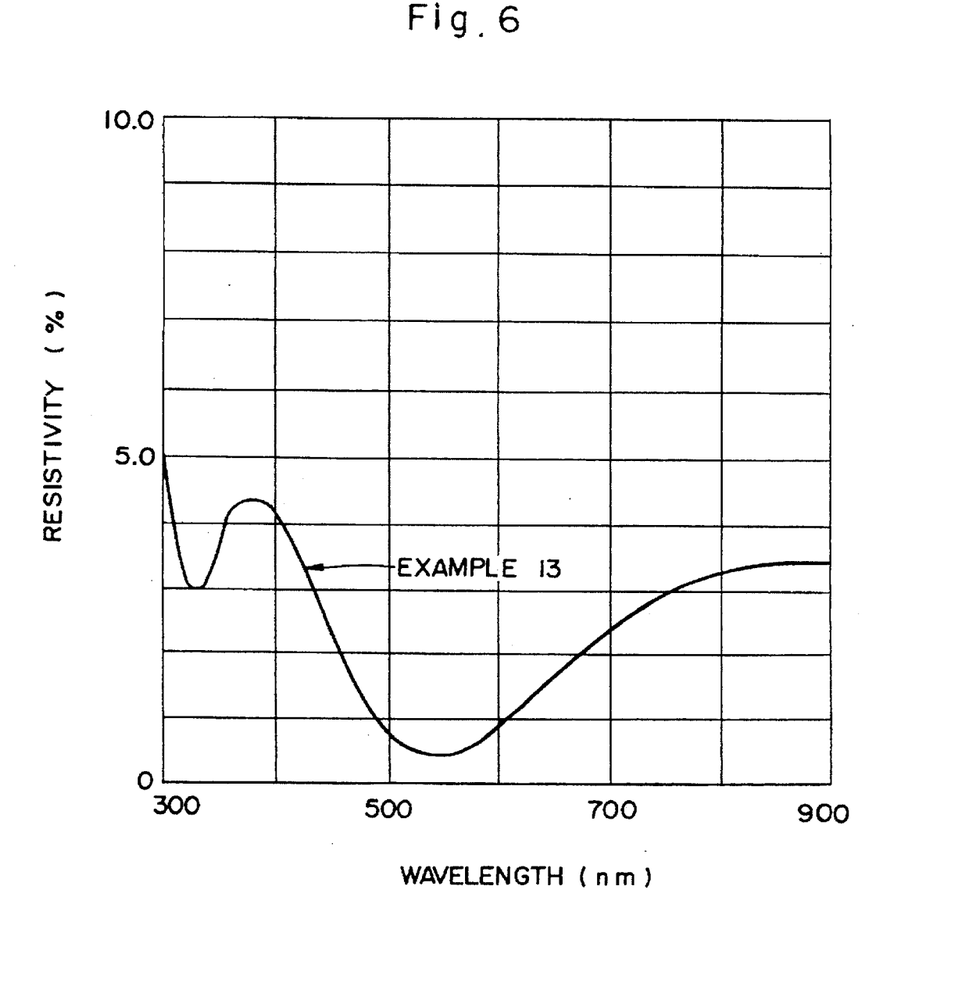
FIG. 6 shows the spectral reflectivity of the transparent, electroconductive substrate obtained in Example 13.

The spectral reflectivity of the transparent, electroconductive substrate having a surface resistivity (measured by 4-needles probing method) of 28.4 kΩ/□, a whole-ray transmittance of 95.2% and a haze value of 0.4%, that had been obtained by the same process as in Example 10, is shown in FIG. 6.

EXAMPLE 14

10 g of a transparent, electroconductive ITO ink prepared by dispersing ultra-fine ITO particles in a solvent (DX-101; made by Tohoku Kako KK) were diluted with 40 g of isophorone. The resulting liquid was coated on a soda lime glass support having a size of 75 mm×75 mm and a thickness of 1 mm, by spin coating at a rotation speed of 1200 rpm, and dried at 40° C. for 10 minutes and then at 80° C. for 10 minutes. Prior to this coating, a metallo-organic Au paste (H91C-3; made by N. E. Chemcat Co.) was coated on the soda lime support at a thickness of about 0.1 µm to form Au electrodes thereon, as shown in FIG. 2. The spin-coated ITO film on the support, excepting the part between the Au electrodes, was removed by wiping it this was baked in air at 450° C. for 30 minutes and then in nitrogen at 450° C. for 20 minutes, and thereafter cooled to form a transparent, electroconductive film on the support. The film thickness, the surface resistivity and the optical characteristics of the thus-coated support were measured. The film thickness was measured by observing the cross section of the sample with an electromicroscope. The results obtained are shown in Table 4 below.

Next, a liquid prepared by diluting 5 g of a solution, that had been obtained by mixing 20.8 g of tetraethyl silicate, 20.8 g of ethyl alcohol and 7.2 g of 0.2N-hydrochloric acid followed by hydrolyzing the resulting mixture at 40° C. for 2 hours, with 5 g of ethyl alcohol was coated over the electroconductive film, by spin coating at a rotation speed of 1200 rpm, and dried at room temperature for 5 minutes and then at 100° C. for 20 minutes. The film thickness, the surface resistivity and the optical characteristics of the thus-prepared, transparent, electroconductive substrate were measured. To measure the film thickness, a part of the un-hardened overcoat film was peeled from the support along with the electroconductive film, immediately after having coated the overcoating liquid on the electroconductive film, and, after the thus-peeled film was hardened, its thickness was measured with a surface roughness meter (Surfcom 900A; made by Tokyo Seimitsu KK). Thus, the thickness of the film thus measured does not include the thickness of the support.

The test results obtained are shown in Table 4 below.

EXAMPLE 15

The same process as in Example 14 was repeated, except that the spin-coated support was dried at room temperature for 5 minutes and then baked in nitrogen at 450° C. for 20 minutes to form an ITO film thereon. The thus-obtained substrate was tested, and the test results obtained are shown in Table 4.

The whole-ray transmittance and the haze value of the substrate were measured through the support, using a directly-reading haze computer EGM-ZPD (made by Suga Tester Co.); and the surface resistivity thereof was measured, using LORESTA MCO-T400 (made by Mitsubishi Petrochemical Co.).

TABLE 1

| Example | | Surface Resistivity (kΩ/□) | Whole-ray Transmittance (%) | Haze Value (%) | Film Thickness (μm) | Specific resistance of Electroconductive Film (Ω · cm) | Volume Content of ITO Particles in Electroconductive Film (vol. %) |
|---|---|---|---|---|---|---|---|
| 1 | before overcoated | 383 | 84.0 | 4.5 | 1.35 | 51.7 | 60.2 |
|   | after overcoated | 0.63 | 86.6 | 1.3 | 1.65 | 0.085 | — |
| 2 | before overcoated | 602 | 87.6 | 2.7 | 0.6 | 36.1 | 69.1 |
|   | after overcoated | 0.86 | 89.9 | 1.1 | 0.8 | 0.052 | — |
| 3 | before overcoated | 1500 | 88.9 | 2.4 | 0.3 | 45 | 58.9 |
|   | after overcoated | 1.7 | 90.7 | 0.9 | 0.6 | 0.051 | — |
| 4 | before overcoated | 7500 | 92.0 | 1.4 | 0.15 | 113 | — |
|   | after overcoated | 8.5 | 93.8 | 0.5 | 0.35 | 0.13 | — |
| 5 | overcoat-baked | 1.3 | 93.4 | 0.8 | 0.35 | 0.02 | — |

TABLE 2

| | Components | Content (wt. %) |
|---|---|---|
| Transparent Electroconductive ITO Ink 1 | Ultra-fine ITO Particles (SUFP-HI; made by Sumitomo Metal Mining Co.) | 11.7 |
| | Isophorone | 88.3 |
| Transparent Electroconductive ITO Ink 2 | Ultra-fine ITO Particles (SUFP-HI; made by Sumitomo Metal Mining Co.) | 27.5 |
| | Isophorone | 72.5 |
| Transparent Electroconductive ITO Ink 3 | Ultra-fine ITO Particles (SUFP-HI; made by Sumitomo Metal Mining Co.) | 1.9 |
| | Isophorone | 10.6 |
| | Methyl Isobutyl Ketone | 37.5 |
| | Acetone | 50.0 |
| Overcoating Liquid 1 | Silica Sol | 7.7 |
| | Ethyl Alcohol | 37.3 |
| | Isopropyl Alcohol (IPA) | 30.0 |
| | N-butyl Alcohol | 20.0 |
| | Water | 5.0 |
| Overcoating Liquid 2 | Silica Sol | 8.8 |
| | Ethyl Alcohol | 36.2 |
| | Isopropyl Alcohol (IPA) | 30.0 |
| | N-butyl Alcohol | 20.0 |
| | Water | 5.0 |
| Overcoating Liquid 3 | Silica Sol | 7.9 |
| | Ethyl Alcohol | 37.1 |
| | Isopropyl Alcohol (IPA) | 30.0 |
| | N-butyl Alcohol | 20.0 |
| | Water | 5.0 |

TABLE 3

| | Examples | | | Comparative Examples | |
|---|---|---|---|---|---|
| | 8 | 9 | 10 | 2 | 3 |
| Surface Resistivity (kΩ/□) | | | | | |
| 4-needles probing method | 26.1 | 9.5 | 24.6 | — | — |
| impedance-measuring method | 15.5 | 5.5 | 19.3 | — | — |
| Whole-ray Transmittance (%) | 96.0 | 94.8 | 95.2 | 93.2 | 92.7 |
| Haze Value (%) | 0.1 | 0.1 | 0.3 | 0.0 | 0.0 |
| Visual Reflectivity Y (%) | 0.80 | 1.17 | 0.87 | 2.75 | 2.80 |
| Chromaticity Coordinates, x | 0.2722 | 0.3139 | 0.2442 | 0.3063 | 0.3048 |
| Chromaticity Coordinates, y | 0.2219 | 0.2556 | 0.2033 | 0.3164 | 0.3159 |
| Thickness of Electroconductive Film (μm) | 0.08 | 0.23 | 0.10 | — | — |
| Thickness of Overcoat Film (μm) | 0.10 | 0.10 | 0.085 | — | — |
| Specific resistance of Electroconductive Film (Ω · cm) | 0.12 | 0.13 | 0.19 | — | — |
| Volume Content of ITO Particles in Electroconductive Film (vol. %) | 60.1 | 62.5 | 53.4 | — | — |

TABLE 4

| | Coating of ITO Ink on Glass Support | Overcoating Liquid | Condition for Hardening of Overcoat Layer | | Surface Resistivity (Ω/□) | Whole-ray Transmittance (%) | Haze Value (%) | Thickness of Film (μm) |
|---|---|---|---|---|---|---|---|---|
| Example 14 | spin coating at 1200 rpm | Tetraethyl Silicate Ethyl Alcohol 0.2N-HCl | 100° C. × 20 min | un-overcoated | 1500 | 91.9 | 1.9 | 0.2 |
| | | | | overcoated | 7000 | 92.9 | 0.7 | 0.4 |
| Example 15 | spin coating at | Tetraethyl Silicate | 450° C. × 20 min, | un- | 1500 | 91.9 | 1.9 | 0.2 |

TABLE 4-continued

| | | | Properties of Film | | | |
|---|---|---|---|---|---|---|
| Coating of ITO Ink on Glass Support | Overcoating Liquid | Condition for Hardening of Overcoat Layer | | Surface Resistivity (Ω/□) | Whole-ray Transmittance (%) | Haze Value (%) | Thickness of Film (μm) |
| 1200 rpm | Ethyl Alcohol 0.2N-HCl | in $N_2$ | overcoated overcoated | 1300 | 93.8 | 1.1 | 0.4 |

As has been described in detail hereinabove, the present invention provides a high-quality, low-priced, transparent, electroconductive substrate having a small surface resistivity and having excellent optical characteristics and weather resistance, and it is most suitably used in liquid crystal displays (LCD), electrodes in solar batteries, etc., and anti-static shields or electromagnetic wave shields in Braun tubes, etc. In addition, the present invention also provides a method for producing the transparent, electroconductive substrate at high yields, without needing any expensive devices, and the producibility of the method is high.

While the invention has been described in detail and with reference to specific embodiments thereof, it will be apparent to one skilled in the art that various changes and modifications can be made therein without departing from the spirit and scope thereof.

What is claimed is:

1. A method for forming a transparent, electroconductive substrate, in which a transparent, electroconductive ink, which is a solution having dispersed therein indium-tin oxide particles having a mean particle size of from 0.01 to 0.05 μm and a binder, is coated and dried on a support capable of transmitting visible rays therethrough to thereby form thereon a transparent, electroconductive film consisting solely of said indium-tin oxide particles, and thereafter an overcoating sol solution consisting essentially of silica sol is coated on said transparent electroconductive film and then dried or dried and baked.

2. A method for forming a transparent, electroconductive substrate as claimed in claim 1, which uses, as said support capable of transmitting visible rays therethrough, a soda lime glass support, a low-alkali glass support or a non-alkali glass support.

3. A method for forming a transparent, electroconductive substrate as claimed in claim 1, which uses, as said overcoating liquid, a silica sol obtained by hydrolyzing an alkyl silicate and the lower condensate thereof in the presence of a catalyst.

4. The method for forming a transparent, electroconductive substrate as claimed in claim 1, in which the coating of the transparent, electroconductive ink and the overcoating liquid on said support is effected by wire bar coating, doctor blade coating, spin coating, dip coating or spray coating.

5. A method for forming a transparent, electroconductive substrate as claimed in claim 1, wherein said solvent for dispersing therein, said indium-tin oxide particles is water or an organic solvent selected from the group consisting of acetone, methyl ethyl ketone, methyl isobutyl ketone, cyclohexanone, isophorone and diacetone alcohol; alcohols selected from the group consisting of methyl alcohol, ethyl alcohol, isopropyl alcohol and butyl alcohol; esters selected from the group consisting of ethyl acetate and butyl acetate; polyalcohol derivatives selected from the group consisting of cellosolve, butyl cellosolve, butyl carbitol and butyl carbitol acetate; N-methylpyrrolidone and N, N-dimethylformamide.

6. A method for forming a transparent, electroconductive substrate as claimed in claim 1, wherein the drying of said overcoat film is effected at temperatures of 80 degrees C or higher and the baking thereof is effected at temperatures of 300degrees C or higher.

7. A method for forming a transparent, electroconductive substrate as claimed in claim 1, wherein said solvent for dispersing therein, said indium-tin oxide particles is water or an organic solvent selected from the group consisting of acetone, methyl ethyl ketone, methyl isobutyl ketone, cyclohexanone, isophorone and diacetone alcohol; alcohols selected from the group consisting of methyl alcohol, ethyl alcohol, isopropyl alcohol or butyl alcohol; esters selected from the group consisting of ethyl acetate or butyl acetate; polyalcohol selected from the group consisting of cellosolve, butyl cellosolve, butyl carbitol and butyl carbitol acetate, N-methylpyrrolidone and N, N-dimethylformamide.

8. A method for forming a transparent, electroconductive substrate, in which a transparent, electroconductive ink, which is a solvent having dispersed therein indium-tin oxide particles having a mean particle size of from 0.01 to 0.05 μm and is coated on a transparent support capable of transmitting visible rays therethrough and then dried and baked to thereby form transparent, electroconductive film on the support, and thereafter an overcoating sol solution consisting essentially of a silica sol is coated on said transparent, electroconductive film and then dried or dried and baked.

9. A method for forming a transparent, electroconductive substrate as claimed in claim 8, which uses, as said support capable of transmitting visible rays therethrough, a soda lime glass support, a low-alkali glass support or a non-alkali glass support.

10. A method for forming a transparent, electroconductive substrate as claimed in claim 8, which uses, as said overcoating liquid, a silica sol obtained by hydrolyzing an alkyl silicate and the lower condensate thereof in the presence of a catalyst.

11. The method for forming a transparent, electroconductive substrate as claimed in claim 8, in which the coating of the transparent, electroconductive ink and the overcoating liquid on said support is effected by wire bar coating, doctor blade coating, spin coating, dip coating or spray coating.

12. The method for forming a transparent, electroconductive substrate as claimed in claim 8, in which said solvent containing a thermoplastic resin therein is vaporized by heating the coated, transparent substrate in air at about 400° C.

13. The method for forming a transparent, electroconductive substrate as claimed in claim 8, in which the drying of said overcoat film is effected at temperatures of 80° C. or higher and the baking thereof is at temperatures of 300° C. or higher.

* * * * *